US 8,871,380 B2

(12) United States Patent
Miyazaki et al.

(10) Patent No.: US 8,871,380 B2
(45) Date of Patent: Oct. 28, 2014

(54) LAMINATED BATTERY

(75) Inventors: Yasuhito Miyazaki, Yokohama (JP);
Naoto Suzuki, Yokosuka (JP)

(73) Assignee: Nissan Motor Co., Ltd., Yokohama-shi (JP)

(*) Notice: Subject to any disclaimer, the term of this patent is extended or adjusted under 35 U.S.C. 154(b) by 100 days.

(21) Appl. No.: 13/812,990

(22) PCT Filed: Jul. 14, 2011

(86) PCT No.: PCT/JP2011/066070
§ 371 (c)(1),
(2), (4) Date: Jan. 29, 2013

(87) PCT Pub. No.: WO2012/014693
PCT Pub. Date: Feb. 2, 2012

(65) Prior Publication Data
US 2013/0130082 A1    May 23, 2013

(30) Foreign Application Priority Data
Jul. 30, 2010  (JP) ................. 2010-172270

(51) Int. Cl.
H01M 2/02       (2006.01)
H01M 6/46       (2006.01)

(52) U.S. Cl.
USPC ............ 429/179; 429/152; 429/159; 429/178

(58) Field of Classification Search
None
See application file for complete search history.

(56) References Cited

U.S. PATENT DOCUMENTS

| | | | |
|---|---|---|---|
| 6,103,416 | A | 8/2000 | Bäuerlein et al. |
| 6,689,176 | B2 | 2/2004 | Jen et al. |
| 6,919,144 | B2 | 7/2005 | Miyazaki et al. |
| 7,179,565 | B2 | 2/2007 | Okohi et al. |
| 7,368,203 | B2 | 5/2008 | Iwanaga et al. |
| 7,851,088 | B2 | 12/2010 | Takahashi et al. |
| 2001/0036573 | A1 | 11/2001 | Jen et al. |

(Continued)

FOREIGN PATENT DOCUMENTS

| | | |
|---|---|---|
| EP | 1 418 638 A2 | 5/2004 |
| JP | 2000-040530 A | 2/2000 |

(Continued)

OTHER PUBLICATIONS

Taiwanese Search Report dated Dec. 24, 2013, (4 pgs.).

(Continued)

Primary Examiner — Cynthia K. Walls
(74) Attorney, Agent, or Firm — Foley & Lardner LLP

(57) ABSTRACT

A bipolar battery (2) is constructed by laminating a plurality of bipolar electrodes (3), each constituted by a layer-form collector (4), a positive electrode active material layer (5) disposed on one surface of the collector (4), and a negative electrode active material layer (6) disposed on another surface of the collector (4), via an electrolyte layer (7). A voltage detection terminal (21a, 21b) is attached to a peripheral edge portion of the collector (4). By disposing a voltage detection terminal (21b) of an adjacent collector (4) on an opposite side of a second straight line (Da2), which passes through a centroid (O) of the collector (4) and is orthogonal to a first straight line (Da1) that connects the voltage detection terminal (21a) to the centroid (O) of the collector (4), a state of charge within an identical unit cell (15) is made even.

6 Claims, 14 Drawing Sheets

2 BIPOLAR BATTERY
3 BIPOLAR ELECTRODE
4 COLLECTOR
5 POSITIVE ELECTRODE ACTIVE MATERIAL LAYER
6 NEGATIVE ELECTRODE ACTIVE MATERIAL LAYER
7 ELECTROLYTE LAYER
11 SEAL MEMBER
15 UNIT CELL
21a, 21b, 21c, 21d VOLTAGE DETECTION TERMINAL
22a, 22b, 22c, 22d WIRE

(56) References Cited

U.S. PATENT DOCUMENTS

| | | |
|---|---|---|
| 2003/0104279 A1 | 6/2003 | Miyazaki et al. |
| 2004/0038123 A1 | 2/2004 | Hisamitsu et al. |
| 2004/0048158 A1 | 3/2004 | Okochi et al. |
| 2004/0072080 A1 | 4/2004 | Iwanaga et al. |
| 2004/0229123 A1 | 11/2004 | Takahashi et al. |
| 2005/0066520 A1 | 3/2005 | Shu et al. |
| 2005/0141170 A1 | 6/2005 | Honda et al. |
| 2010/0028767 A1 | 2/2010 | Inose et al. |
| 2010/0178553 A1 | 7/2010 | Murata |
| 2011/0014520 A1 | 1/2011 | Ueda |
| 2013/0157092 A1 | 6/2013 | Suzuki et al. |

FOREIGN PATENT DOCUMENTS

| | | |
|---|---|---|
| JP | 2004-87238 A | 3/2004 |
| JP | 2004-319362 A | 11/2004 |
| JP | 2005-011658 A | 1/2005 |
| JP | 2005-174844 A | 6/2005 |
| JP | 2005-235428 A | 9/2005 |
| JP | 2005-310667 A | 11/2005 |
| JP | 2006-127857 A | 5/2006 |
| JP | 2008-192377 A | 8/2008 |
| JP | 2009-158281 A | 7/2009 |
| JP | 2010-073558 A | 4/2010 |
| JP | 2011-082097 A | 4/2011 |
| RU | 2260867 C1 | 9/2005 |
| RU | 2 298 264 C2 | 4/2007 |
| TW | 492207 B | 6/2002 |
| TW | 499766 B | 8/2002 |
| TW | 506154 | 10/2002 |
| TW | 565961 B | 12/2003 |
| TW | 580777 B | 3/2004 |
| TW | 200512975 A | 4/2005 |
| TW | 1239672 B | 9/2005 |
| TW | 1286849 B | 9/2007 |
| TW | 201014010 A | 4/2010 |
| WO | WO 01/91209 A1 | 11/2001 |
| WO | WO 03/007415 A1 | 1/2003 |
| WO | WO-2010/010717 A1 | 1/2010 |
| WO | WO 2010/081150 A1 | 7/2010 |

OTHER PUBLICATIONS

N. Suzuki et al., US PTO Non-Final Office Action, U.S. Appl. No. 13/819,445 dated Apr. 3, 2014, (7 pgs.).
Taiwanese Office Action dated Dec. 4, 2013, (4 pgs.).
Japanese Office Action dated Dec. 24, 2013, (3 pgs.).
Russian Decision on Grant and English language translation dated Jun. 25, 2014, 14 pgs.
Russian Decision on Grant and English language translation dated May 15, 2014, 14 pgs.
N. Suzuki et al., US PTO Notice of Allowance dated Jul. 16, 2014, 9 pgs.

2 BIPOLAR BATTERY
3 BIPOLAR ELECTRODE
4 COLLECTOR
5 POSITIVE ELECTRODE ACTIVE MATERIAL LAYER
6 NEGATIVE ELECTRODE ACTIVE MATERIAL LAYER
7 ELECTROLYTE LAYER
11 SEAL MEMBER
15 UNIT CELL
21a, 21b, 21c, 21d VOLTAGE DETECTION TERMINAL
22a, 22b, 22c, 22d WIRE

2 BIPOLAR BATTERY
4a FIRST COLLECTOR
4b SECOND COLLECTOR
4c THIRD COLLECTOR
4d FOURTH COLLECTOR
15a FIRST UNIT CELL
15b SECOND UNIT CELL
15c THIRD UNIT CELL
21a FIRST VOLTAGE DETECTION TERMINAL
21b SECOND VOLTAGE DETECTION TERMINAL
21c THIRD VOLTAGE DETECTION TERMINAL
21d FOURTH VOLTAGE DETECTION TERMINAL

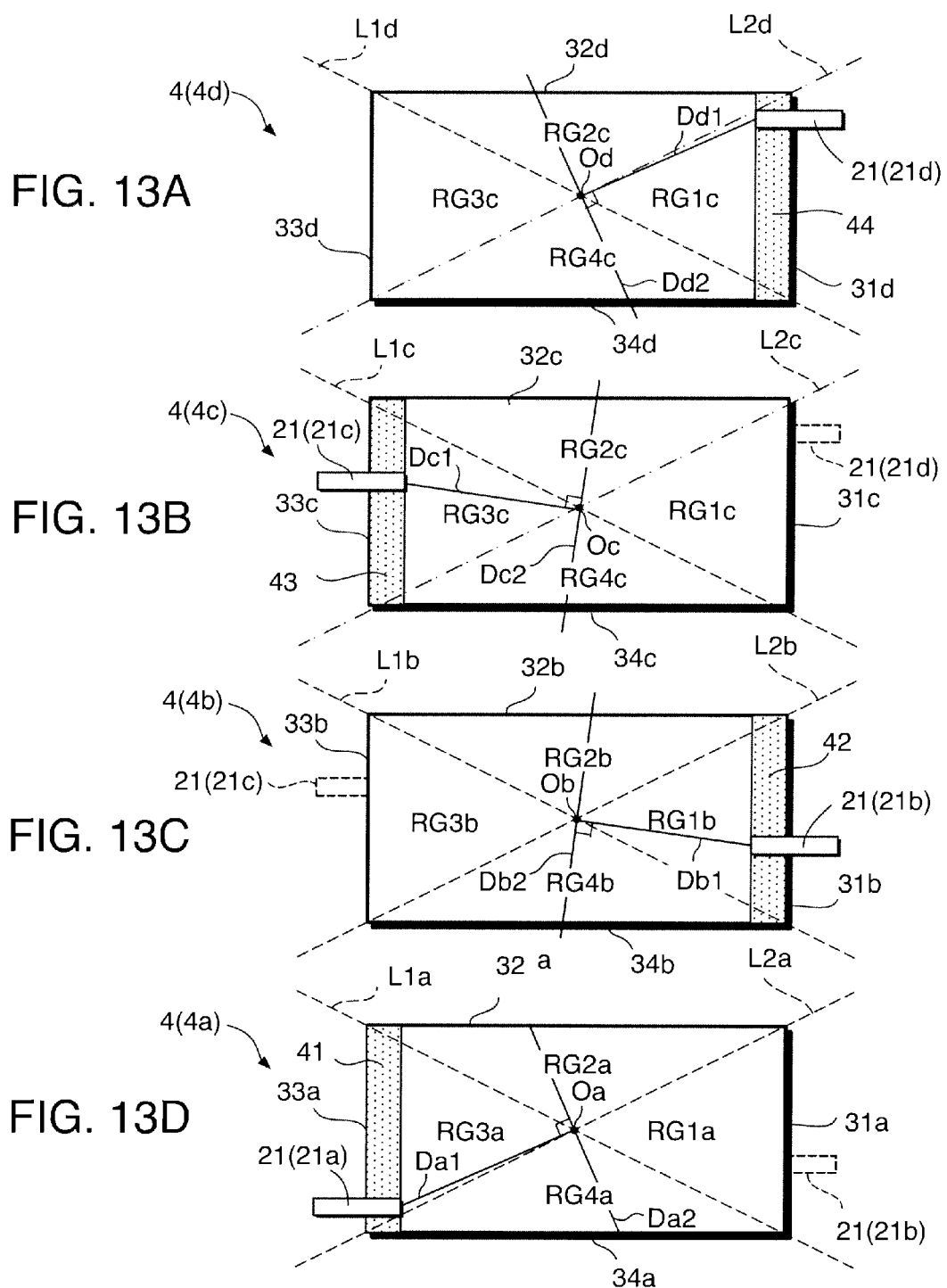

US 8,871,380 B2

LAMINATED BATTERY

FIELD OF THE INVENTION

This invention relates to an arrangement of voltage detection terminals attached to collectors of a bipolar battery.

BACKGROUND OF THE INVENTION

In a bipolar battery in which a plurality of bipolar electrodes, each having a positive electrode active material layer formed on one surface of a collector and a negative electrode active material layer formed on another surface of the collector, are laminated via an electrolyte layer. Unit cells constituting such a bipolar battery may have a fluctuation in its performance such as an internal resistance, capacity, and so on due to factors arising during manufacture. The unit cells are connected in series for use in the bipolar battery. However, when variation exists in a voltage of each unit cell, deterioration advances from a unit cell having a high voltage, and as a result, a life of the entire bipolar battery shortens.

To extend the life of the entire bipolar battery, therefore, the voltage of each unit cell is preferably measured, whereupon the voltage of each unit cell is adjusted on the basis of the measured voltages.

JP 2005-235428A, published by the Japan Patent Office in 2005, teaches that in order to measure the voltage of each unit cell of a bipolar battery, a voltage detection terminal is to be attached to the collector of each unit cell so that a voltage can be extracted from each unit cell and measured.

SUMMARY OF THE INVENTION

In this bipolar battery according to the prior art, the collector has a rectangular planar shape when seen from a lamination direction. The voltage detection terminals are attached in positions corresponding to an identical side when seen from the lamination direction.

When the voltage detection terminals are arranged in this manner, unevenness is likely to occur in a voltage distribution within an identical plane of the layer-form unit cells during discharge for the purpose of voltage regulation using the voltage detection terminal. As a result, variation may occur in a state of charge among different sites of an identical unit cell following completion of the discharge.

It is therefore an object of this invention to equalize a state of charge within an identical plane of a unit cell.

In order to achieve the above object, a bipolar battery according to this invention is constructed by laminating a plurality of bipolar electrodes, each comprising a layer-form collector, a positive electrode active material layer disposed on one surface of the collector, and a negative electrode active material layer disposed on another surface of the collector, via an electrolyte layer. The collector comprises a voltage detection terminal attached to a peripheral edge portion of the collector.

Providing that a straight line connecting a centroid of a collector and a voltage detection terminal attached thereto is a first straight line, the voltage detection terminal and a voltage detection terminal of an adjacent collector are disposed on opposite sides of a second straight line that passes through the centroid and is orthogonal to the first straight line.

The details as well as other features and advantages of this invention are set forth in the remainder of the specification and are shown in the accompanying drawings. It should be noted that thicknesses and shapes of respective layers constituting the bipolar battery might be exaggerated in the accompanying drawings in order to facilitate description.

BRIEF DESCRIPTION OF THE DRAWINGS

FIGS. 13A-13D are plan views of four collectors constituting a bipolar battery according to a third embodiment of this invention.

DESCRIPTION OF THE PREFERRED EMBODIMENTS

Figure 1:
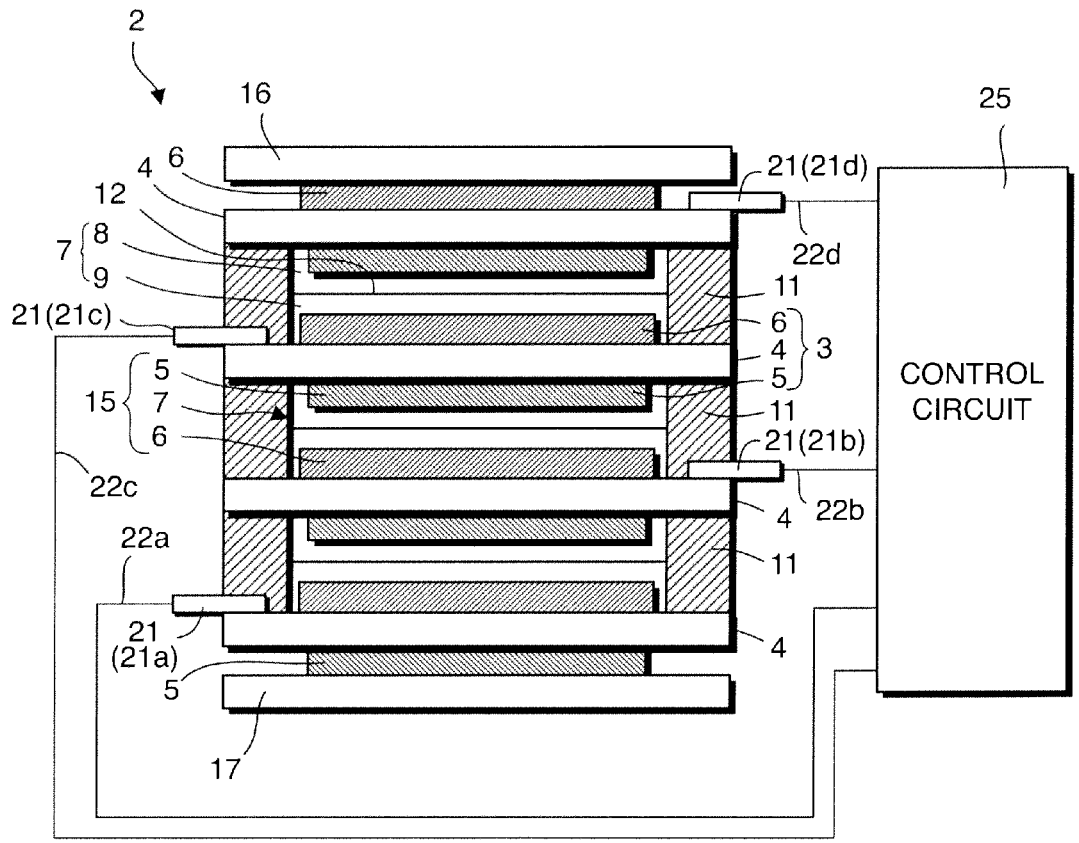
FIG. 1 is a schematic longitudinal sectional view of a bipolar battery according to a first embodiment of this invention.
Figure 2:
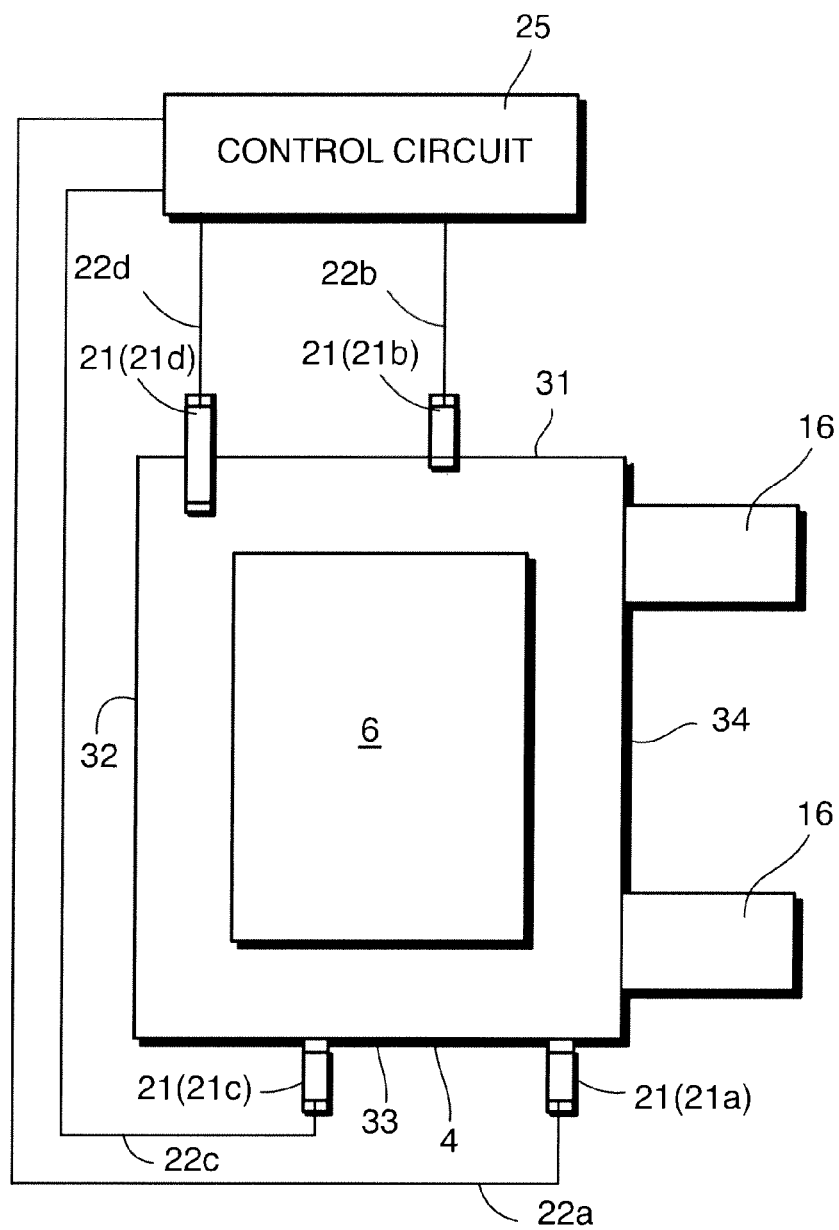
FIG. 2 is a plan view of the bipolar battery seen from above.

Referring to FIG. 1 of the drawings, a bipolar battery 2 according to a first embodiment of this invention comprises four rectangular collectors 4 laminated via separators 12.

The collector 4 is formed from a conductive polymer material or a nonconductive polymer material to which a conductive filler is added. The collector 4 is not limited to resin and may be formed from a metal. A positive electrode active material layer 5 and a negative electrode active material layer 6 are formed respectively on a vertical lower surface and a vertical upper surface of the collector 4 when the collector 4 is laid horizontally, as shown in the figure. The collector 4 and the positive electrode active material layer 5 and negative electrode active material layer 6 formed on either side thereof together constitute a bipolar electrode 3. The bipolar battery 2 therefore comprises four bipolar electrodes 3.

The negative electrode active material layer 6 is set to have a larger surface area than the positive electrode active material layer 5. The single bipolar battery 2 is formed by laminating the bipolar electrodes 3 in a vertical direction via electrolyte layers 7 and electrically connecting the laminated bipolar electrodes 3 in series.

Here, two bipolar electrodes 3 adjacent to each other in the vertical direction in the figure will be referred to for descriptive purposes as an upper stage bipolar electrode and a lower stage bipolar electrode. The upper stage bipolar electrode and the lower stage bipolar electrode are disposed such that the negative electrode active material layer 6 positioned on an upper surface of the lower stage bipolar electrode and the positive electrode active material layer 5 positioned on a lower surface of the upper stage bipolar electrode face each other via the electrolyte layer 7.

The respective surface areas of the positive electrode active material layer 5 and the negative electrode active material layer 6 are set to be smaller than a horizontal direction surface area of the collector 4. In other words, the positive electrode active material layer 5 and the negative electrode active material layer 6 are not provided in a peripheral edge region of the collector 4 when seen from the lamination direction. A seal member 11 having a predetermined width is sandwiched between the peripheral edge regions of two collectors 4 adjacent to each other in the lamination direction. The seal member 11 insulates the positive electrode active material layer 5 and the negative electrode active material layer 6 from each other and secures a predetermined space 8 between the positive electrode active material layer 5 and the negative electrode active material layer 6 opposing each other in the vertical direction of the figure. The seal member 11 is disposed on an outer side of a horizontal direction outer periphery of the positive electrode active material layer 5 and the negative electrode active material layer 6.

The electrolyte layer 7 is constituted by a liquid-form or gel-form electrolyte 9 charged into the space 8.

The separator 12 is formed from a porous membrane through which the electrolyte 9 can pass, and provided in the space 8 in which the electrolyte 9 is charged. The separator 12 serves to prevent electric contact between the two opposing electrode active material layers 5 and 6.

A high current tab 16 is connected to the negative electrode active material layer 6 on an uppermost stage and a high current tab 17 is connected to the positive electrode active material layer 5 on a lowermost stage. In the charged bipolar battery 2, the high current tab 16 functions as a positive terminal and the high current tab 17 functions as a negative terminal.

A single unit cell 15 is constituted by the electrolyte layer 7 and the positive electrode active material layer 5 and negative electrode active material layer 6 on either side of the electrolyte layer 7. The bipolar battery 2 is constructed by connecting three unit cells 15 in series.

Figure 3:
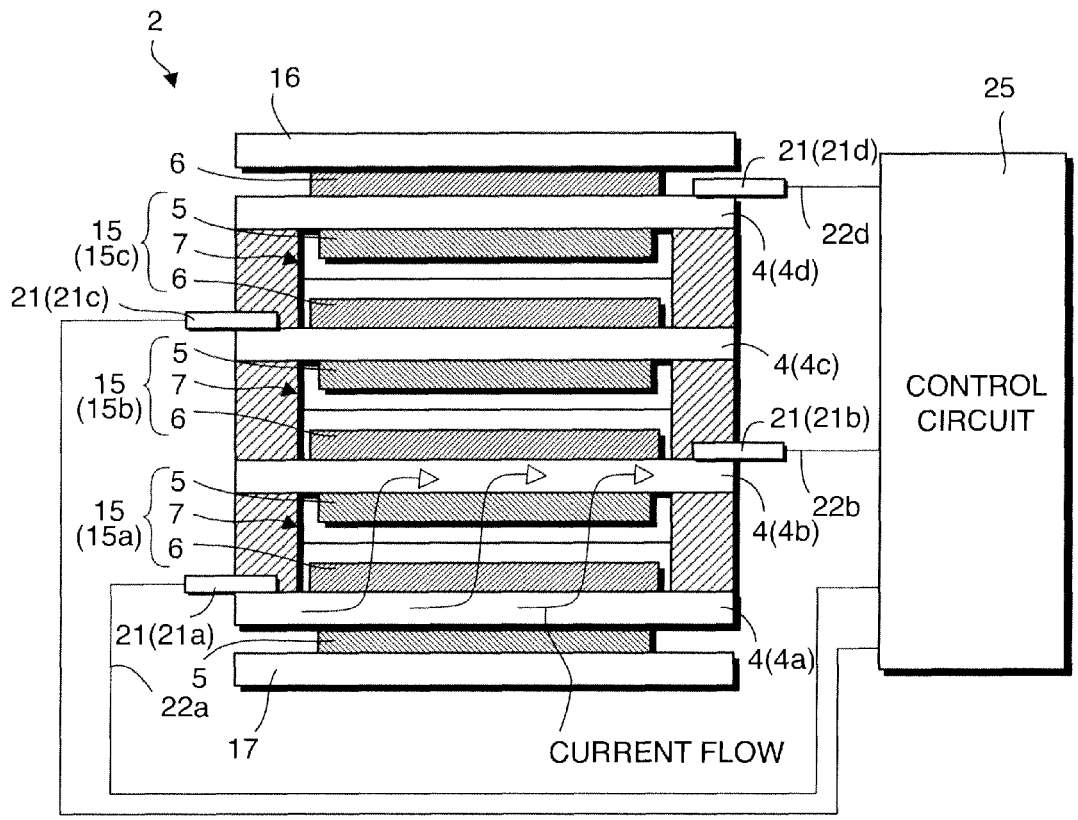
FIG. 3 is a schematic longitudinal sectional view of the bipolar battery, illustrating a flow of electricity through the bipolar battery.

Referring to FIG. 3, in the following description, the three unit cells 15 will be referred to, in vertically descending order, as a first unit cell 15a, a second unit cell 15b, and a third unit cell 15c. FIG. 3 shows the bipolar battery 2 according to the first embodiment of this invention, identically to FIG. 1. A number of unit cells 15 and a number of bipolar batteries 2 connected in series may be adjusted in accordance with a desired voltage.

When voltages allocated to the three unit cells 15a, 15b, 15c connected in series are not equal, a desired battery voltage cannot be obtained from the bipolar battery 2 as a whole. Therefore, to measure the voltages of the respective unit cells 15a, 15b, 15c in the bipolar battery 2, a voltage detection terminal 21a, a voltage detection terminal 21b, a voltage detection terminal 21c, and a voltage detection terminal 21d are attached to a first collector 4a, a second collector 4b, a third collector 4c, and a fourth collector 4d, respectively. Thus, the respective voltages of the unit cells 15a, 15b, 15c are extracted to the outside. Further, wires 22a to 22d are connected to the voltage detection terminals 21a to 21d. The wires 22a to 22d are connected to a control circuit 25. To alleviate a voltage imbalance among the three unit cells 15a, 15b, 15c, the control circuit 25 causes a unit cell having a high voltage to perform discharge on the basis of the detected voltages of the unit cells 15a, 15b, 15c. It should be noted that this discharge is performed using the voltage detection terminals 21a to 21d.

More specifically, voltage measurement and discharge are performed on the first unit cell 15a using the voltage detection terminals 21a and 21b. Voltage measurement and discharge are performed on the second unit cell 15b using the voltage detection terminals 21b and 21c. Voltage measurement and discharge are performed on the third unit cell 15c using the voltage detection terminals 21c and 21d.

Referring to FIGS. 9A-9D, each collector 4a to 4d has a rectangular outer shape when seen from the lamination direction, or in other words the vertical direction of FIG. 1. Hence, each collector 4a to 4d has four sides 31, 32, 33, 34.

The voltage detection terminals 21a, 21b, 21c, and 21d are attached to the four collectors 4a to 4d using a method such as adhesion. It should be noted that in order to detect the voltages of N unit cells, N+1 voltage detection terminals are required.

Here, the four collectors 4a to 4d will be referred to as the first collector 4a, the second collector 4b, the third collector 4c, and the fourth collector 4d.

Figure 4:
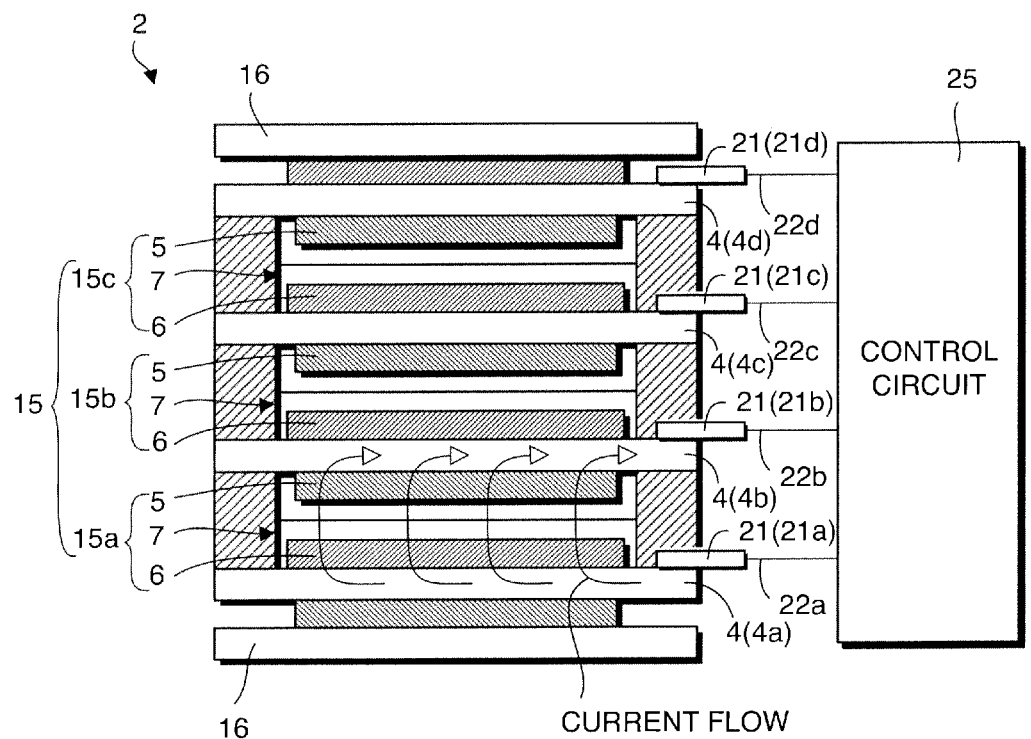
FIG. 4 is a schematic longitudinal sectional view of a bipolar battery according to the prior art.
Figure 5:
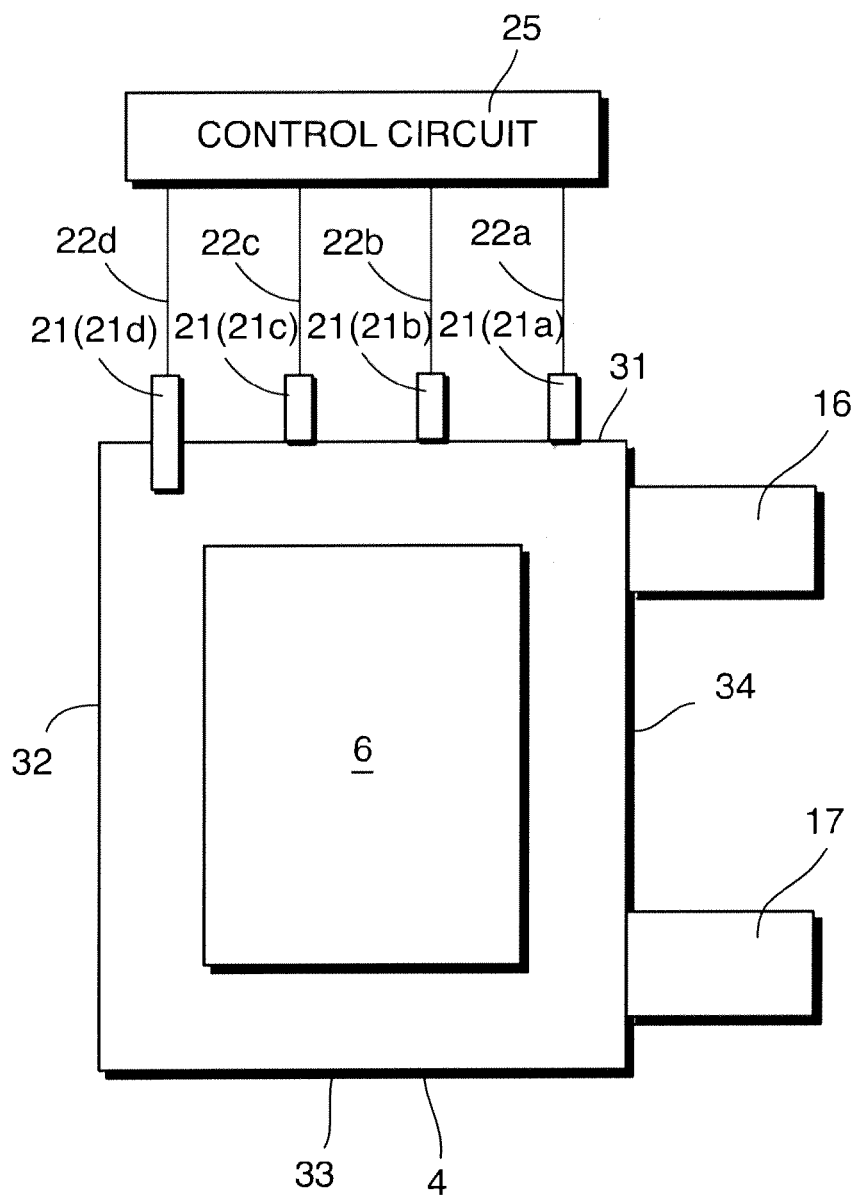
FIG. 5 is a plan view of the bipolar battery according to the prior art seen from above.

Referring to FIGS. 4 and 5, in a bipolar battery 2 according to the prior art, the voltage detection terminals 21a to 21d are attached in identical positions on the respective sides 31 when seen from the lamination direction. In this case, unevenness occurs in a voltage distribution within a plane of the unit cell 15 during the discharge performed for the purpose of voltage adjustment, and as a result, unevenness occurs in a state of charge of the unit cell 15 following completion of the discharge. Offset in a current density distribution within the plane of the unit cell 15 occurs particularly strikingly when a resin material having lower conductivity than a metallic material is used for the collectors 4a to 4d.

Figure 6:
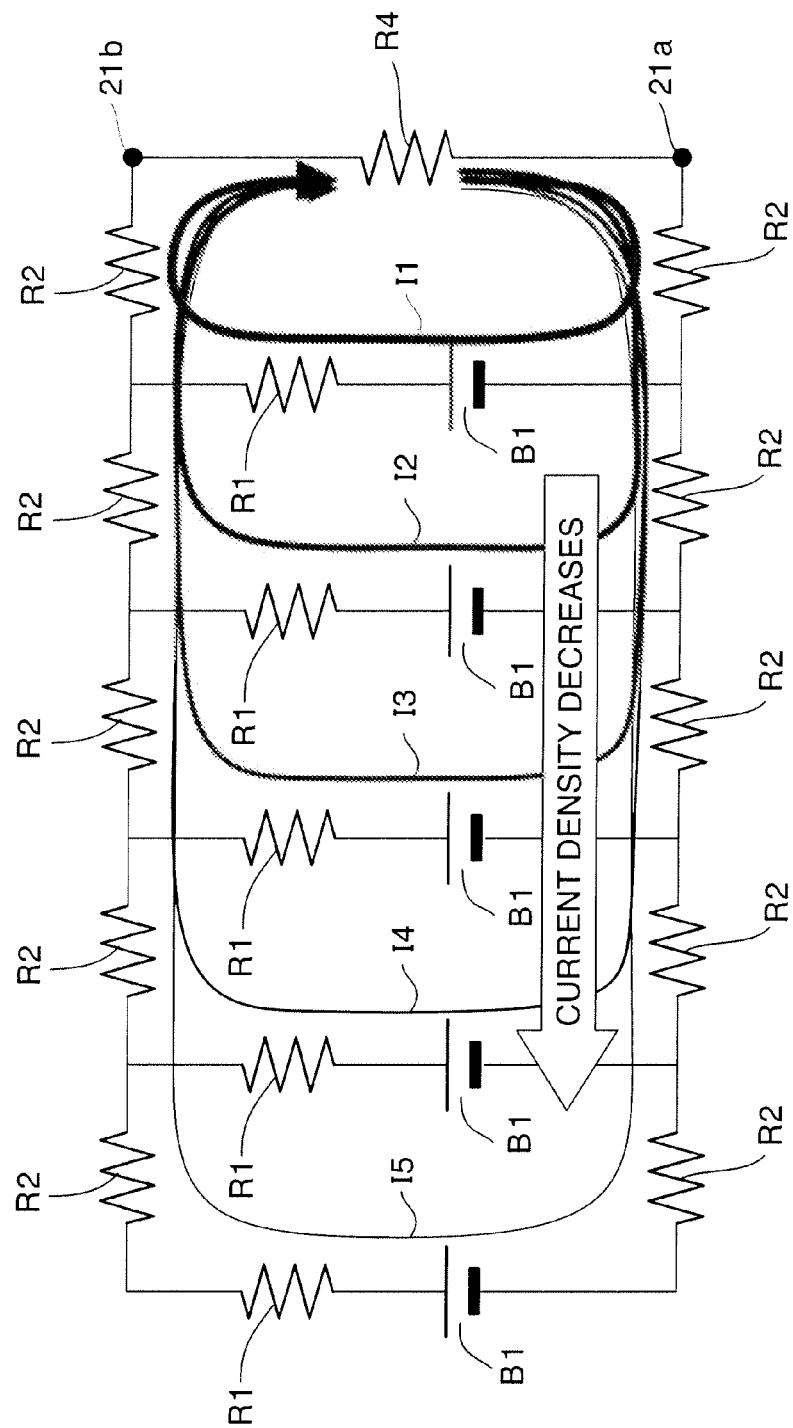
FIG. 6 is a circuit diagram of a current distribution within a unit cell of the bipolar battery according to the prior art.

Referring to FIG. 6, the unit cell 15a, which is a layer-form unit cell, has a rectangular planar shape when seen from the lamination direction, and may be considered to comprise a plurality of, for example five, small battery elements B1 connected in parallel within a single plane.

Here, resistors R1 are connected in series to the five small battery elements B1. The resistor R1 signifies a battery direct current resistance. Resistors R2 at the top and bottom of the figure signify in-plane resistance elements. The pair of voltage detection terminals 21a and 21b serving as discharge terminals of the first unit cell 15a are both positioned on a right end of the figure. During discharge of the unit cell 15, the voltage detection terminals 21a and 21b are connected via a discharge resistor R4.

In the figure, of five discharge paths passing through the respective small battery elements B1, a path of a discharge current I1 that passes through the small battery element B1 positioned closest to the pair of voltage detection terminals 21a and 21b has a shortest length and a smallest resistance value. The lengths of the discharge current paths passing through the small battery elements B1, and the resistance values of the paths, increase steadily toward the small battery element B1 positioned furthest from the pair of voltage detection terminals 21a and 21b. Accordingly, the path of a discharge current I5 that passes through the small battery element B1 positioned furthest from the pair of voltage detection terminals 21a and 21b has the greatest length and the largest resistance value of the five paths.

Figure 7:
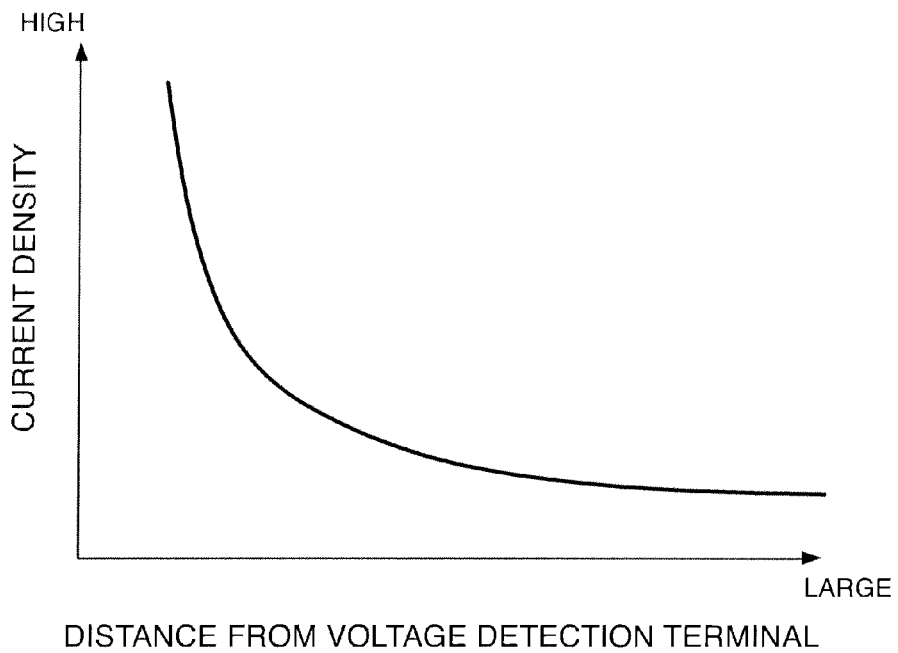
FIG. 7 is a diagram illustrating a relationship between a current density and a distance from a voltage detection terminal provided on the unit cell of the bipolar battery according to the prior art.

Referring to FIG. 7, in the bipolar battery 2 according to the prior art, a current density within an identical plane of the unit cell 15a decreases steadily as a distance from the pair of voltage detection terminals 21a and 21b increases.

Figure 8:
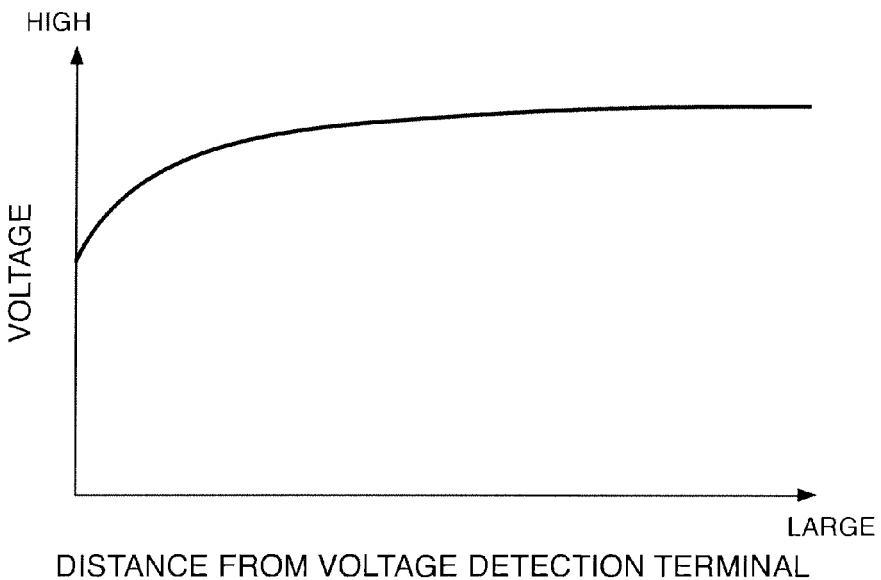
FIG. 8 is a diagram illustrating a relationship between a voltage and the distance from the voltage detection terminal of the bipolar battery according to the prior art.

Referring to FIG. 8, in the bipolar battery 2 according to the prior art, the voltage distribution of the unit cell 15a following the completion of discharge varies such that the voltage decreases steadily toward the small battery clement B1 closest to the pair of voltage detection terminals 21a and 21b. In other words, discharge advances steadily more quickly toward the small battery element B1 closest to the pair of voltage detection terminals 21a and 21b.

Hence, in the bipolar battery 2 according to the prior art, voltage unevenness occurs within the plane of the unit cell 15a during a period up to the completion of discharge. Unevenness in the state of charge within an identical plane of the unit cell 15, which should be even, indicates that a location having a higher voltage than the measured voltage of the unit cell 15a may exist in the same unit cell 15a. When such a site exists, depending on the manner in which the battery is used, the battery may be locally overcharged without realizing. This applies likewise to the unit cells 15b and 15c.

Referring again to FIGS. 9A-9D, in the bipolar battery 2 according to the first embodiment of this invention, the voltage detection terminals 21a to 21d are attached singly to respective peripheral edge portions of the collectors 4a to 4d. Attachment is performed by adhesion, for example. FIGS. 9A to 9D show the planar shapes of the collectors 4a to 4d individually in order to show the arrangement of the voltage detection terminals 21a to 21d.

Figure 9A:
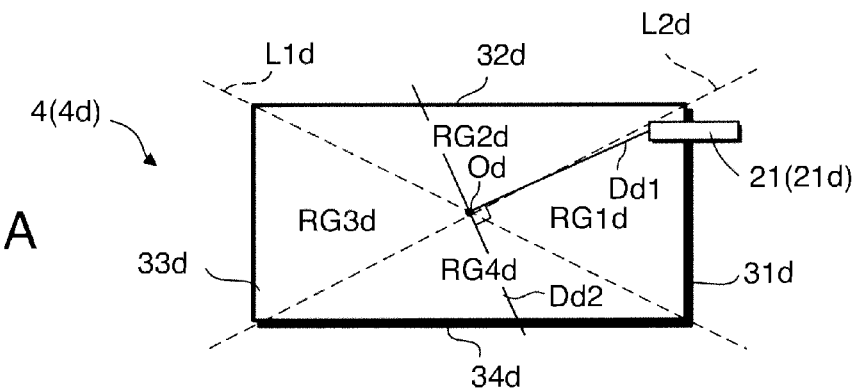
FIGS. 9A-9D are plan views of four collectors constituting the bipolar battery according to the first embodiment of this invention.
Figure 9B:
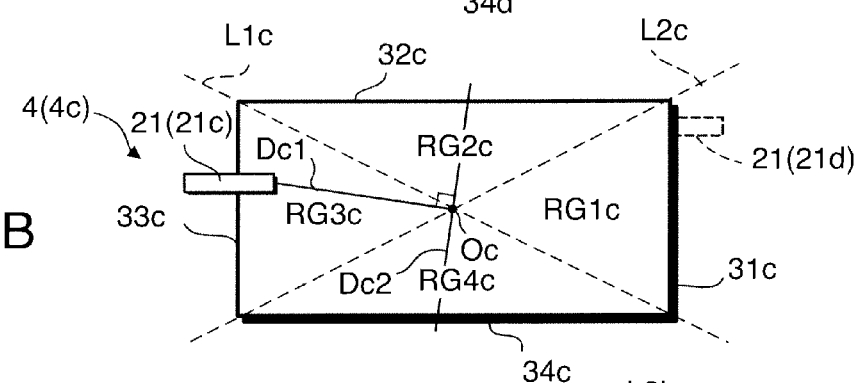
Figure 9C:
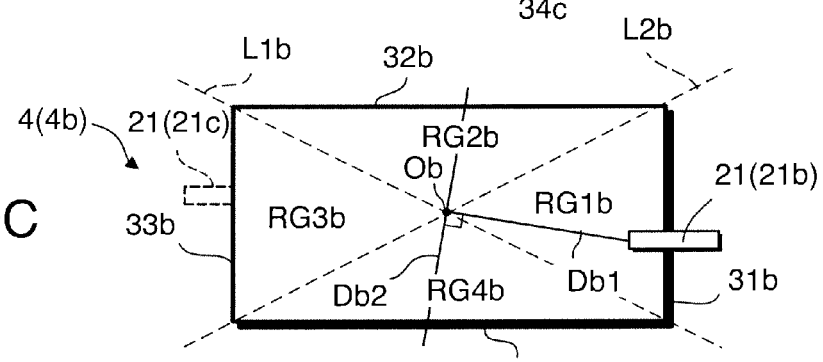
Figure 9D:
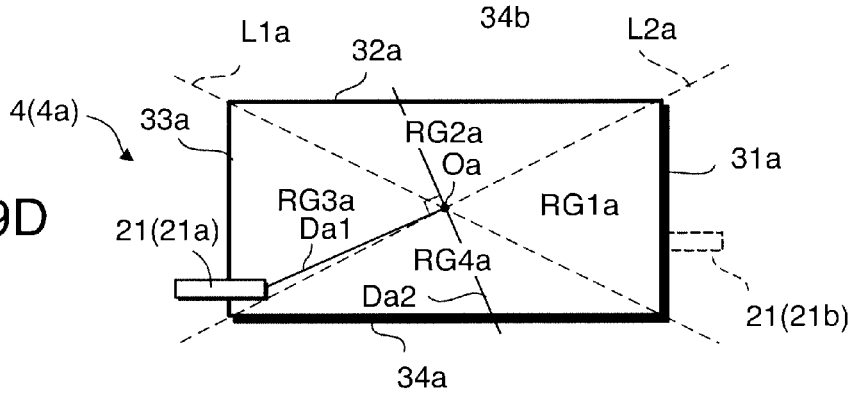

Referring to FIG. 9D, the voltage detection terminal 21a of the first collector 4a and the voltage detection terminal 21b of the second collector 4b, which are adjacent to each other in the lamination direction, are arranged as follows. The voltage detection terminal 21b of the adjacent second collector 4b is disposed on an opposite side of a second straight line Da2, which passes through a centroid Oa of the first collector 4a and is orthogonal to a first straight line Da1 that connects the voltage detection terminal 21a to the centroid Oa of the first collector 4a.

Referring to FIG. 9C, the voltage detection terminal 21b of the second collector 4b and the voltage detection terminal 21c of the third collector 4c, which are adjacent to each other in the lamination direction, are arranged as follows. The voltage detection terminal 21c of the adjacent third collector 4c is disposed on an opposite side of a second straight line Db2, which passes through a centroid Ob of the second collector 4b and is orthogonal to a first straight line Db1 that connects the voltage detection terminal 21b to the centroid Ob of the second collector 4b.

Referring to FIG. 9B, the voltage detection terminal 21c of the third collector 4c and the voltage detection terminal 21d of the fourth collector 4d, which are adjacent to each other in the lamination direction, are arranged as follows. The voltage detection terminal 21d of the adjacent fourth collector 4d is disposed on an opposite side of a second straight line Dc2, which passes through a centroid Oc of the third collector 4c and is orthogonal to a first straight line Dc1 that connects the voltage detection terminal 21c to the centroid Oc of the third collector 4c.

Referring to FIG. 9A, in accordance with the arrangement described above, the voltage detection terminal 21c of the adjacent third collector 4c is positioned on an opposite side of a second straight line Dd2, which passes through a centroid Od of the fourth collector 4d and is orthogonal to a first straight line Dd1 that connects the voltage detection terminal 21d to the centroid Od of the fourth collector 4d.

To summarize the above, in relation to a certain collector 4 and the voltage detection terminal 21 attached thereto, the voltage detection terminal 21 of the adjacent collector 4 is disposed on an opposite side of a second straight line D2, which passes through a centroid O of the collector 4 and is orthogonal to a first straight line D1 that connects the voltage detection terminal 21 to the centroid O of the collector 4. In other words, the two voltage detection terminals 21 attached to adjacent collectors 4 are disposed at an angular interval of at least 90 degrees.

Having satisfied this condition, the voltage detection terminals 21a to 21d are even more preferably arranged as follows.

The planar shape of the collector 4 is divided into four regions by two straight lines passing through the centroid O of the collector 4, and the voltage detection terminal 21 is attached to a side positioned in one of two non-adjacent regions. The voltage detection terminal 21 of the collector 4 that is adjacent in the lamination direction, meanwhile, is attached to a side positioned in the other of the two non-adjacent regions. The two straight lines are preferably constituted by two diagonal lines passing through an apex of the collector 4 having a rectangular planar shape.

More specifically, referring to FIG. 9D, the first collector 4a is divided into four regions RG1a, RG2a, RG3a, and RG4a by the centroid Oa of the first collector 4a and two straight lines L1a and L2a serving as diagonal lines of a rectangle, and the voltage detection terminal 21a is disposed in one region RG3a of two non-adjacent regions RG1a and RG3a. The voltage detection terminal 21b of the adjacent second collector 4b is disposed in a corresponding position in the other region RG1a of the two non-adjacent regions RG1a and RG3a.

Referring to FIG. 9C, the second collector 4b is divided into four regions RG1b, RG2b, RG3b, and RG4b by the centroid Ob of the second collector 4b and two straight lines L1b and L2b serving as diagonal lines of a rectangle, and the voltage detection terminal 21b is disposed in one region RG1b of two non-adjacent regions RG1b and RG3b. The voltage detection terminal 21c of the adjacent third collector 4c is disposed in a corresponding position in the other region RG3b of the two non-adjacent regions RG1b and RG3b.

Referring to FIG. 9B, the third collector 4c is divided into four regions RG1c, RG2c, RG3c, and RG4c by the centroid Oc of the third collector 4c and two straight lines L1c and L2c serving as diagonal lines of a rectangle, and the voltage detection terminal 21c is disposed in one region RG3c of two non-adjacent regions RG and RG3c. The voltage detection terminal 21d of the adjacent fourth collector 4d is disposed in a corresponding position in the other region RG of the two non-adjacent regions RG and RG3c.

According to research conducted by the inventors, the voltage detection terminals 21a to 21d of the adjacent collectors 4a to 4d are preferably disposed at angular intervals between 150 and 210 degrees. Alternatively, the two non-adjacent regions in which the voltage detection terminals 21a to 21d are provided are preferably regions in which an intersection angle of the two straight lines L1a (L1b, L1c, L1d) and L2a (L2b, L2c, L2d) serving as the diagonal lines of the rectangle is an acute angle.

The reason for this is that when the voltage detection terminals 21a to 21d are attached in regions where the intersection angle of the two straight lines L1a (L1b, L1c, L1d) and L2a (L2b, L2c, L2d) serving as the diagonal lines of the rectangle is an acute angle, adjacent voltage detection terminals 21a to 21d can be disposed further from each other than when the voltage detection terminals 21a to 21d are attached in regions where the intersection angle of the two straight lines L1a (L1b, L1c, L1d) and L2a (L2b, L2c, L2d) is an obtuse angle.

Figure 10:
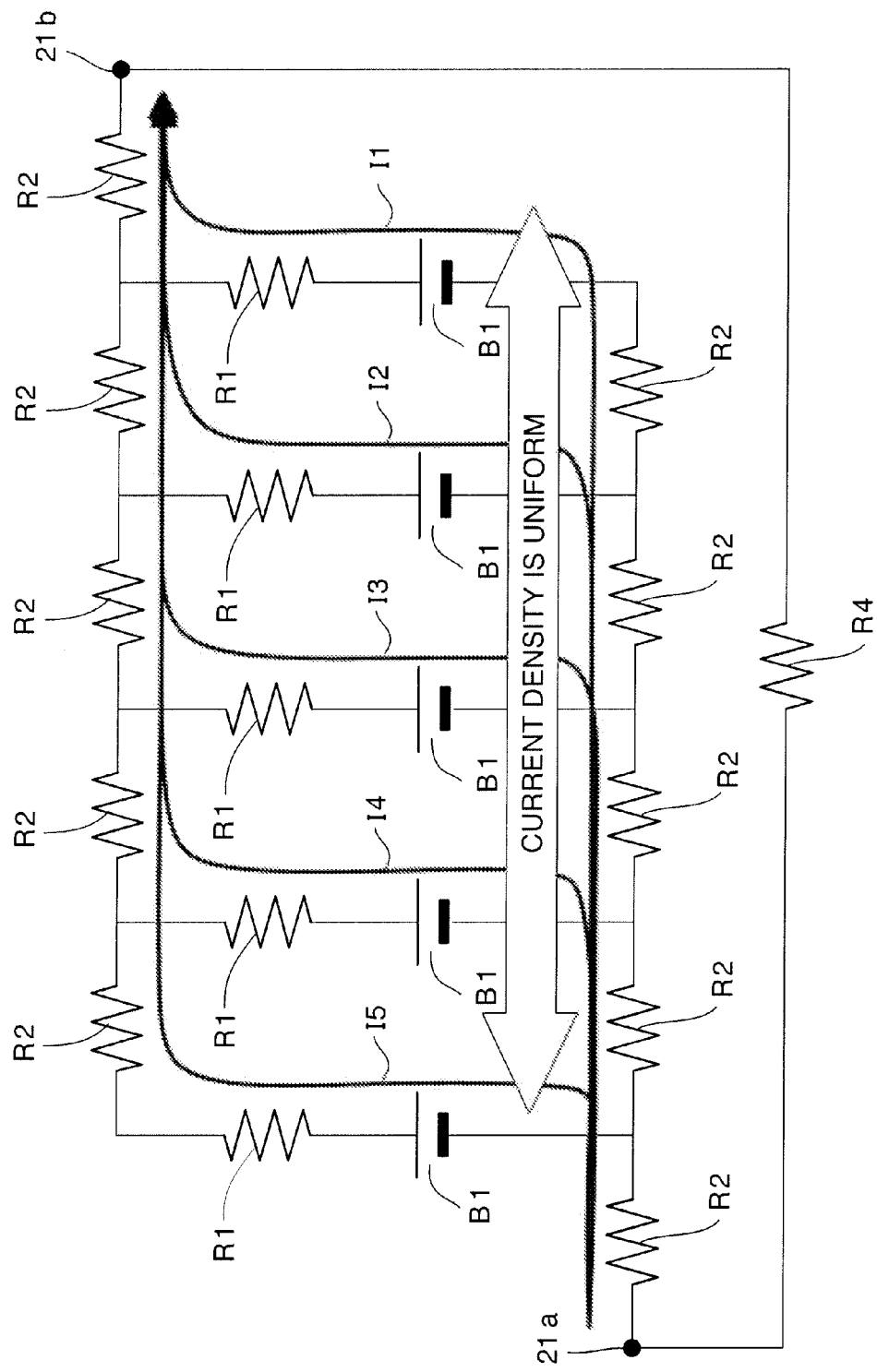
FIG. 10 is a circuit diagram of a current distribution within a unit cell of the bipolar battery according to the first embodiment of this invention.

Next, referring to FIG. 10, the manner in which a discharge current flows through the interior of the unit cells 15a to 15c in the bipolar battery 2 in which the voltage detection terminals 21a to 21d have the above arrangement will be described.

As described above in relation to FIG. 6, the first unit cell 15a, which is a layer-form unit cell, is rectangular when seen from the lamination direction, and may be considered to comprise a plurality of, for example five, small battery elements B1 connected in parallel within a single plane. This applies likewise to the second unit cell 15b and the third unit cell 15c.

As shown in FIG. 3, the voltage of the first unit cell 15a is detected by the voltage detection terminals 21a and 21b attached respectively to the collectors 4a and 4b on either side of the first unit cell 15a.

The voltage detection terminal 21a and the voltage detection terminal 21b are positioned on a left end and a right end of the figure, respectively. Therefore, the lengths of the discharge current paths passing through the five small battery elements B1 are substantially equal. Resistance on all of the five discharge paths between the voltage detection terminals 21a and 21b in the figure is constituted by a single resistor R1 and six resistors R2. In other words, the five discharge paths have substantially equal resistance values.

As a result, magnitudes of discharge currents I1 to I5 passing respectively through the five small battery elements B1 are also substantially equal. Therefore, discharge is performed evenly within the plane of the first unit cell 15a from all of the five small battery elements B1, regardless of the positions thereof.

Figure 11:
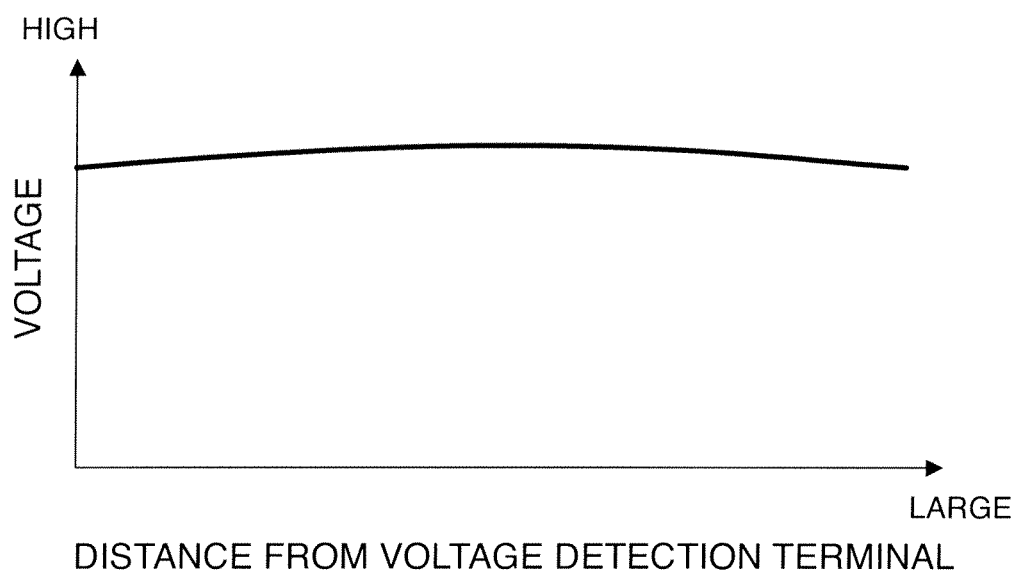
FIG. 11 is a diagram illustrating a relationship between a voltage and a distance from a voltage detection terminal of the bipolar battery according to the first embodiment of this invention.

Referring to FIG. 11, since discharge is performed evenly, the voltage distribution within the first unit cell 15a following completion of the discharge remains constant regardless of the distance from the voltage detection terminal 21a. In other words, voltage unevenness such as that shown in FIG. 8, which is brought about by the arrangement of the voltage detection terminals according to the prior art, does not occur. Hence, according to the bipolar battery 2, evenness can be expected in the voltage distribution within the plane of the unit cell 15a (15b, 15c).

As described above, in the bipolar battery 2, the resistance on the discharge path extending from one voltage detection terminal 21a (21b, 21c) of the unit cell 15a (15b, 15c) to the other voltage detection terminal 21b (21c, 21d) is uniform on all paths. Accordingly, the current density is equal in all locations of the plane of the unit cell 15a (15b, 15c), and therefore the state of charge within the unit cell 15a (15b, 15c) can be shifted in parallel at an identical level. Further, the voltage following completion of the discharge, detected by the pair of voltage detection terminals 21a and 21b (21b and 21c or 21c and 21d), is identical in all parts of the unit cell 15a (15b, 15c), and therefore voltage detection can be performed with a high degree of precision.

The bipolar battery 2 according to this embodiment uses the collectors 4a to 4d having a rectangular planar shape, but this invention may also be applied to a bipolar battery that uses collectors having a polygonal shape other than a rectangular shape.

Further, the planar shape of the collector is not limited to a polygonal shape having an apex, and may be any shape, such as a circular shape or an elliptical shape.

Referring to FIGS. 12A to 12D, a second embodiment of this invention, which is applied to a bipolar battery 2 having collectors 4aa, 4ba, 4ca, and 4da shaped as described above, will be described.

Likewise in this embodiment, similarly to the first embodiment, the bipolar battery 2 is constituted by the four collectors 4aa, 4ba, 4ca, and 4da. In contrast to the first embodiment, however, the collectors 4aa to 4da have a planar shape that is not symmetrical and does not comprise an apex.

The voltage detection terminal 21a, the voltage detection terminal 21b, the voltage detection terminal 21c, and the voltage detection terminal 21d are attached to the first collector 4aa, the second collector 4ba, the third collector 4ca, and the fourth collector 4da, respectively.

FIGS. 12A-12D, similarly to FIGS. 9A-9D, but show an arrangement of the voltage detection terminals 21a to 21d on the collectors 4aa to 4da.

Figure 12A:
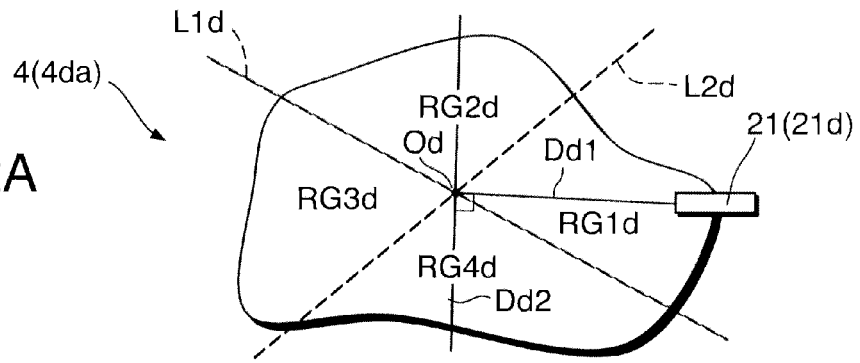
FIGS. 12A-12D are plan views of four collectors constituting a bipolar battery according to a second embodiment of this invention.
Figure 12B:
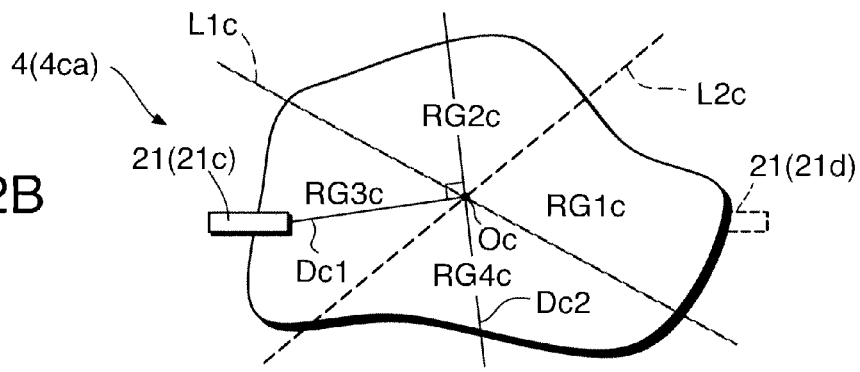
Figure 12C:
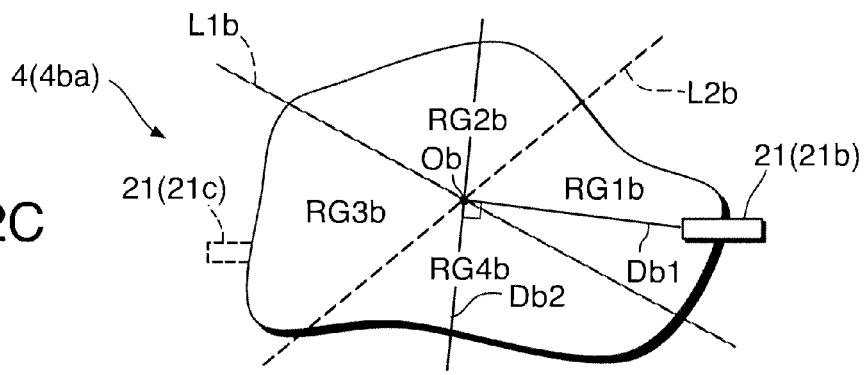
Figure 12D:
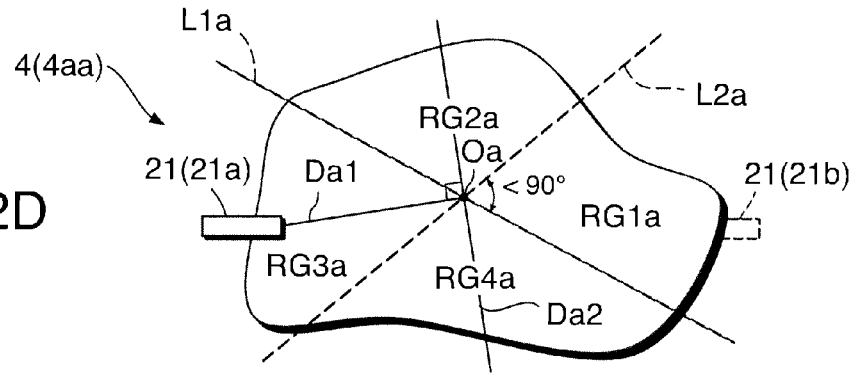

Referring to FIG. 12D, the voltage detection terminals 21a and 21b of the first collector 4aa and the second collector 4ba, which are adjacent to each other in the lamination direction, are arranged as follows. The voltage detection terminal 21b of the adjacent second collector 4ba is disposed on an opposite side of a second straight line Da2, which passes through the centroid Oa of the first collector 4aa and is orthogonal to a first straight line Da1 that connects the voltage detection terminal 21a to the centroid Oa of the first collector 4aa.

Referring to FIG. 12C, the voltage detection terminals 21b and 21c of the second collector 4ba and the third collector 4ca, which are adjacent to each other in the lamination direction, are arranged as follows. The voltage detection terminal 21c of the adjacent third collector 4ca is disposed on an opposite side of a second straight line Db2, which passes through the centroid Ob of the second collector 4ba and is orthogonal to a first straight line Db1 that connects the voltage detection terminal 21b to the centroid Ob of the second collector 4ba.

Referring to FIG. 12B, the voltage detection terminals 21c and 21d of the third collector 4ca and the fourth collector 4da, which are adjacent to each other in the lamination direction, are arranged as follows. The voltage detection terminal 21d of the adjacent fourth collector 4da is disposed on an opposite side of a second straight line Dc2, which passes through the centroid Oc of the third collector 4ca and is orthogonal to a first straight line Dc1 that connects the voltage detection terminal 21c to the centroid Oc of the third collector 4ca.

Referring to FIG. 12A, in accordance with the arrangement described above, the voltage detection terminal 21c of the adjacent third collector 4ca is positioned on an opposite side of a second straight line Dd2, which passes through the centroid Od of the fourth collector 4da and is orthogonal to a first straight line Dd1 that connects the voltage detection terminal 21d to the centroid Od of the fourth collector 4da.

Likewise in this embodiment, the voltage detection terminals 21 attached respectively to two adjacent collectors 4 are disposed at an angular interval of at least 90 degrees.

Having satisfied this condition, the voltage detection terminals 21a to 21d are even more preferably arranged as follows.

The planar shape of the collector 4 is divided into four regions by two straight lines passing through the centroid O of the collector 4, and the voltage detection terminal 21 is disposed on a side positioned in one of two non-adjacent regions.

More specifically, referring to FIG. 12D, the first collector 4aa is divided into the four regions RG1a, RG2a, RG3a, and RG4a by the two straight lines L1a and L2a passing through the centroid Oa of the first collector 4aa, and the voltage detection terminal 21a is disposed in one region RG3a of the two non-adjacent regions RG1a and RG3a. The voltage detection terminal 21b of the adjacent second collector 4ba is disposed in a corresponding position in the other region RG1a of the two non-adjacent regions RG1a and RG3a.

Referring to FIG. 12C, the second collector 4ba is divided into the four regions RG1b, RG2b, RG3b, and RG4b by the two straight lines L1b and L2b passing through the centroid Ob of the second collector 4 ba, and the voltage detection terminal 21b is disposed in one region RG1b of the two non-adjacent regions RG1b and RG3b. The voltage detection terminal 21c of the adjacent third collector 4ca is disposed in a corresponding position in the other region RG3b of the two non-adjacent regions RG1b and RG3b.

Referring to FIG. 12B, the third collector 4ca is divided into the four regions RG1c, RG2c, RG3c, and RG4c by the centroid Oc of the third collector 4ca and the two straight lines L1c and L2c passing through the centroid Oc of the second collector 4 ca, and the voltage detection terminal 21c is disposed in one region RG3c of the two non-adjacent regions RG1c and RG3c. The voltage detection terminal 21d of the adjacent fourth collector 4da is disposed in a corresponding position in the other region RG1c of the two non-adjacent regions RG1c and RG3c.

The voltage detection terminal 21a is preferably attached in a region where the intersection angle between the two straight lines L1a and L2a of the first collector 4a is an acute angle. This applied likewise to the voltage detection terminal 21b. Even more preferably, the voltage detection terminals 21 of two adjacent collectors 4 are disposed at an angular interval between 150 and 210 degrees.

According to this embodiment, as described above, this invention can also be applied to the collectors 4aa to 4da having a planar shape that is not symmetrical and does not comprise an apex, and in so doing, an imbalance in the state of charge within an identical plane of the unit cell can be eliminated.

Referring to FIGS. 13A-13D, a third embodiment of this invention will be described.

Likewise in this embodiment, similarly to the first embodiment, the bipolar battery 2 is constituted by the four collectors 4a, 4b, 4c, and 4d. FIGS. 13A-13D show an arrangement of the voltage detection terminals 21a to 21d on the collectors 4a to 4d, similarly to FIGS. 9A-9D. The collectors 4a to 4d have a similar rectangular planar shape to those of the first embodiment.

In the bipolar battery 2 according to this embodiment, conductors 41 to 44 having high electric conductivity and a predetermined width are adhered in advance to the sides of the collectors 4a to 4d to which the voltage detection terminals 21a to 21d are attached.

Referring to FIG. 13D, a thin film-shaped first conductor 41 is adhered in advance over an entire length of a side 33a of the first collector 4a to which the voltage detection terminal 21a is attached.

Referring to FIG. 13C, a thin film-shaped second conductor 42 is adhered in advance over an entire length of a side 31b of the second collector 4b to which the voltage detection terminal 21b is attached.

Referring to FIG. 13B, a thin film-shaped third conductor 43 is adhered in advance over an entire length of a side 33c of the third collector 4c to which the voltage detection terminal 21c is attached.

Referring to FIG. 13A, a thin film-shaped fourth conductor 44 is adhered in advance over an entire length of a side 31 d of the fourth collector 4d to which the voltage detection terminal 21d is attached. The respective voltage detection terminals 21a to 21d are attached to the conductors 41 to 44 using a method such as adhesion.

Figure 14:
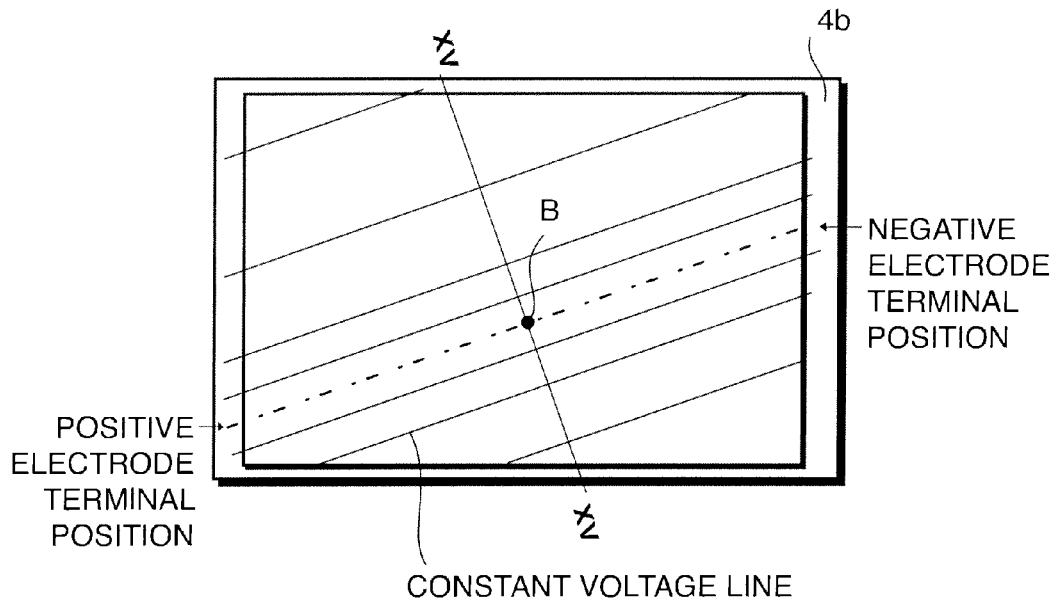
FIG. 14 is a schematic plan view of a collector illustrating an arrangement of the voltage detection terminals on the unit cell of the bipolar battery according to the first embodiment of this invention.

Referring to FIG. 14, a reason for adhering the conductors 41 to 44 to the respective sides 33a, 31b, 33c, 31d to which the voltage detection terminals 21a to 21d are attached will be described.

FIG. 14 is a schematic plan view of the first unit cell 15a of the bipolar battery 2 according to the first embodiment. In the bipolar battery 2 according to the first embodiment, as shown in FIGS. 9C-9D, the voltage detection terminal 21a is attached to a lower portion of the side 33a of the first collector 4a. Further, the voltage detection terminal 21b is attached to a substantially central portion of the side 31b of the second collector 4b.

In FIG. 14, "positive electrode terminal position" corresponds to an attachment position of the voltage detection terminal 21a, while "negative electrode terminal position" corresponds to an attachment position of the voltage detection terminal 21b.

During discharge from the first unit cell 15a, a constant voltage line is parallel to a straight line connecting the pair of voltage detection terminals 21a and 21b. Following completion of the discharge, the voltage distribution within the first unit cell 15a taken along an orthogonal line to the constant voltage line, or in other words an XV-XV line in FIG. 14, for example, is as shown in FIG. 15.

Figure 15:
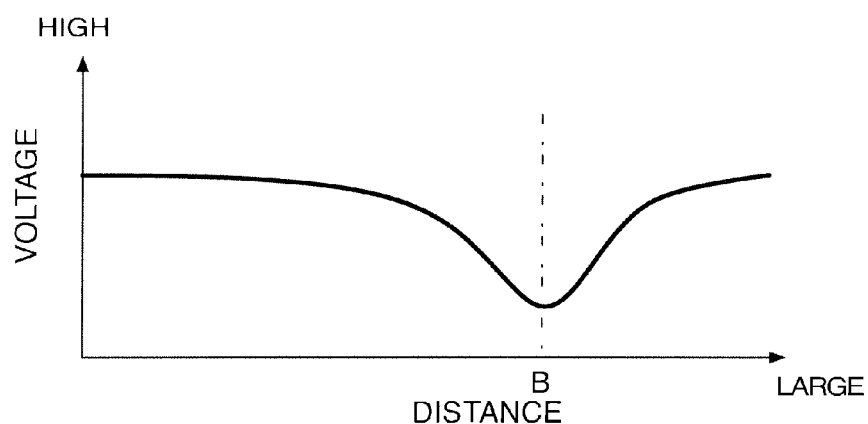
FIG. 15 is a diagram showing a voltage distribution following the completion of discharge in a unit cell, cut along an XV-XV line in FIG. 14.

Referring to FIG. 15, the voltage is at a minimum in a predetermined position B, and increases steadily away from the position B on both sides thereof. Hence, a tendency toward a voltage distribution having a minimum value in the predetermined position B appears strikingly in a collector having high electric resistance, such as a resin collector.

The predetermined position B shown in FIG. 15 is a position where the XV-XV line of FIG. 14 intersects the straight line connecting the pair of voltage detection terminals 21a and 21b. The reason why the voltage following completion of the discharge reaches a minimum in this position is that in a bipolar battery including collectors that have high electric resistance, such as resin collectors, discharge is performed most vigorously on a straight line that connects the pair of voltage detection terminals 21a and 21b by a shortest distance.

However, a voltage distribution in which the voltage reaches a minimum in the predetermined position B is not desirable. Therefore, in the bipolar battery 2 according to the third embodiment of this invention, as shown in FIGS. 13A-13D, the conductors 41 to 44 are adhered to the respective sides 33a, 31b, 33c, 31d to which the voltage detection terminals 21a to 21d are attached.

As a result, in the first unit cell 15a, for example, the entire first conductor 41 disposed on the side 33a to which the first collector 4a is attached functions as a voltage detection terminal. Further, the entire second conductor 42 disposed on the side 31b of the second collector 4b functions as a voltage detection terminal.

Figure 16:
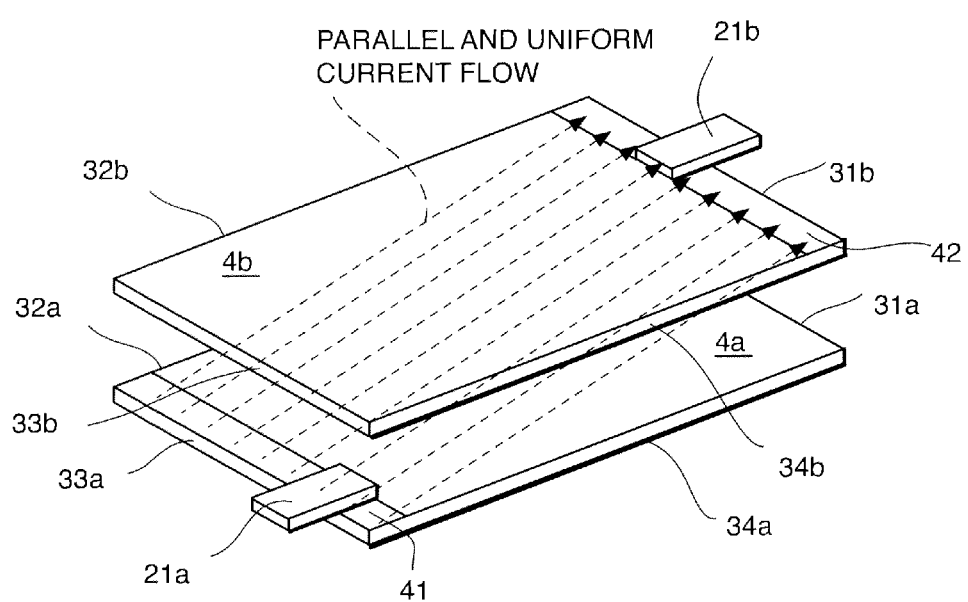
FIG. 16 is a schematic perspective view of main parts of the bipolar battery according to the third embodiment of this invention, illustrating a current distribution within a unit cell of the bipolar battery.

Referring to FIG. 16, in the first unit cell 15a, a discharge current flows from the first conductor 41 toward the second conductor 42. In other words, a positive-negative pair of electrodes are formed by the conductors 41 and 42 as a line rather than a point. As a result, the discharge current flows parallel to a lengthwise direction of the collectors 4a and 4b, or in other words parallel to sides 32a, 32b and sides 34a, 34b extending in a left-right direction of FIG. 1 and FIG. 3, and flows evenly. Hence, the minimum value of the voltage distribution within the first unit cell 15a is eliminated. This applies likewise to the second unit cell 15b and the third unit cell 15c.

To summarize the above, when a collector made of resin or the like, which has much higher electric resistance than a metallic collector, is used, the voltage distribution along an orthogonal orientation to a straight line connecting the pair of voltage detection terminals of the unit cell takes a minimum value on the straight line connecting the pair of voltage detection terminals. As a result, the voltage distribution within the plane of the unit cell is not uniform. In the bipolar battery 2 according to this embodiment, the conductors 41 to 44 are adhered to the sides 33a, 31b, 33c, and 31d on which the voltage detection terminals 21a to 21d are provided. The conductors 41 to 44 make the voltage distribution in the orthogonal direction to the straight line connecting the pair of voltage detection terminals 21a and 21b (21b and 21c, 21c and 21d) equipotent. Therefore, even when the bipolar battery 2 is constructed using the collectors 4a to 4d made of resin or the like, which have much higher electric resistance than metallic collectors, the respective current densities within the unit cells 15a to 15c can be made even.

The contents of Tokugan 2010-172270, with a filing date of Jul. 30, 2010 in Japan, are hereby incorporated by reference.

Although the invention has been described above with reference to certain embodiments, the invention is not limited to the embodiments described above. Modifications and variations of the embodiments described above will occur to those skilled in the art, within the scope of the claims.

For example, in the third embodiment, the conductors 41 to 44 do not necessarily have to be disposed over the entire length of the sides 33a, 31b, 33c, and 31d to which the voltage detection terminals 21a to 21d are attached, and may be adhered to only a part of the sides 33a, 31b, 33c, and 31d centering on the voltage detection terminals 21a to 21d.

INDUSTRIAL FIELD OF APPLICATION

As described above, with the bipolar battery according to this invention, a voltage distribution within a layer-form unit cell is equalized during discharge for the purpose of voltage adjustment. Hence, a favorable effect can be expected in terms of extending the life of a bipolar battery installed as a power supply in an electric vehicle, for example.

The invention claimed is:

1. A bipolar battery in which a plurality of bipolar electrodes, each comprising a layer-form collector, a positive electrode active material layer disposed on one surface of the collector, and a negative electrode active material layer disposed on another surface of the collector, are laminated via an electrolyte layer, and a voltage detection terminal is attached to a peripheral edge portion of the collector, wherein, providing that a straight line connecting a centroid of a collector and a voltage detection terminal attached thereto is a first straight line and a straight line that passes through the centroid and is orthogonal to the first straight line is a second straight line, the voltage detection terminal and a voltage detection terminal attached to an adjacent collector are disposed on opposite sides of the second straight line.

2. The bipolar battery as defined in claim 1, wherein, providing that a planar shape of the collector is divided into four regions by two straight lines intersecting at the centroid, the voltage detection terminals of the adjacent collectors are disposed respectively in one and another of two non-adjacent regions.

3. The bipolar battery as defined in claim 2, wherein the two non-adjacent regions are regions in which an intersection angle of the two straight lines is an acute angle.

4. The bipolar battery as defined in claim 2, wherein the planar shape of the collector is rectangular, and the two straight lines are diagonal lines of a rectangle.

5. The bipolar battery as defined in claim 1, wherein the voltage detection terminals of adjacent collectors are disposed at an angular interval between 150 degrees and 210 degrees.

6. The bipolar battery as defined in claim 1, comprising a plurality of unit cells each of which comprises the electrolyte layer, the positive electrode active material layer and the negative electrode active material layer positioned on either side of the electrolyte layer, and the voltage detection terminal that doubles as a capacity adjustment terminal.

* * * * *